US011698310B2

(12) United States Patent
Youssefi et al.

(10) Patent No.: US 11,698,310 B2
(45) Date of Patent: *Jul. 11, 2023

(54) SLOTTED MEMS FORCE SENSOR

(71) Applicant: NextInput, Inc., Mountain View, CA (US)

(72) Inventors: Mehrnaz Rouhi Youssefi, San Jose, CA (US); Julius Minglin Tsai, San Jose, CA (US)

(73) Assignee: NextInput, Inc., Mountain View, CA (US)

( * ) Notice: Subject to any disclaimer, the term of this patent is extended or adjusted under 35 U.S.C. 154(b) by 155 days.

This patent is subject to a terminal disclaimer.

(21) Appl. No.: 17/215,186

(22) Filed: Mar. 29, 2021

(65) Prior Publication Data
US 2021/0285832 A1    Sep. 16, 2021

Related U.S. Application Data

(63) Continuation of application No. 16/739,687, filed on Jan. 10, 2020, now Pat. No. 10,962,427.

(Continued)

(51) Int. Cl.
*G01L 1/00* (2006.01)
*G01L 1/18* (2006.01)
*B81B 3/00* (2006.01)

(52) U.S. Cl.
CPC .............. *G01L 1/18* (2013.01); *B81B 3/0072* (2013.01); *B81B 2201/0264* (2013.01); *B81B 2203/04* (2013.01)

(58) Field of Classification Search
CPC . G01L 1/18; B81B 3/0072; B81B 2201/0264; B81B 2203/04; G01P 15/125
See application file for complete search history.

(56) References Cited

U.S. PATENT DOCUMENTS 4,594,639 A    6/1986  Kuisma
4,658,651 A    4/1987  Le
(Continued)

FOREIGN PATENT DOCUMENTS

CN    201653605    11/2010
CN    102998037    3/2013
(Continued)

OTHER PUBLICATIONS

Mei, T., et al., "Design and Fabrication of an Integrated Three-Dimensional Tactile Sensor for Space Robotic Applications," Micro Electro Mechanical Systems, MEMS '99, Twelfth IEEE International Conference, Orlando Florida, Jan. 21, 1999, pp. 112-117.

(Continued)

*Primary Examiner* — Max H Noori
(74) *Attorney, Agent, or Firm* — Withrow & Terranova, P.L.L.C.

(57) ABSTRACT

Described herein is a MEMS force sensor with stress concentration design. The stress concentration can be performed by providing slots, whether through or blind, and/or selective thinning of the substrate. The MEMS force sensor is in chip scale package with solder bumps or metal pillars and there are sensing elements formed on the sensor substrate at the stress concentrate area. The stress concentration can be realized through slots, selective thinning and a combination of both.

16 Claims, 5 Drawing Sheets

Related U.S. Application Data

(60) Provisional application No. 62/790,513, filed on Jan. 10, 2019.

(56) References Cited

U.S. PATENT DOCUMENTS

| | | |
|---|---|---|
| 4,814,856 A | 3/1989 | Kurtz et al. |
| 4,849,730 A | 7/1989 | Izumi et al. |
| 4,914,624 A | 4/1990 | Dunthorn |
| 4,918,262 A | 4/1990 | Flowers et al. |
| 4,933,660 A | 6/1990 | Wynne |
| 4,983,786 A | 1/1991 | Stevens |
| 5,095,401 A | 3/1992 | Zavracky et al. |
| 5,159,159 A | 10/1992 | Asher |
| 5,237,879 A | 8/1993 | Speeter |
| 5,320,705 A | 6/1994 | Fujii et al. |
| 5,333,505 A | 8/1994 | Takahashi et al. |
| 5,343,220 A | 8/1994 | Veasy et al. |
| 5,349,746 A | 9/1994 | Gruenwald et al. |
| 5,351,550 A | 10/1994 | Maurer |
| 5,483,994 A | 1/1996 | Maurer |
| 5,510,812 A | 4/1996 | O'Mara et al. |
| 5,541,372 A | 7/1996 | Baller et al. |
| 5,543,591 A | 8/1996 | Gillespie et al. |
| 5,565,657 A | 10/1996 | Merz |
| 5,600,074 A | 2/1997 | Marek et al. |
| 5,673,066 A | 9/1997 | Toda et al. |
| 5,773,728 A | 6/1998 | Tsukada et al. |
| 5,889,236 A | 3/1999 | Gillespie et al. |
| 5,921,896 A | 7/1999 | Boland |
| 5,969,591 A | 10/1999 | Fung |
| 6,028,271 A | 2/2000 | Gillespie et al. |
| 6,159,166 A | 12/2000 | Chesney et al. |
| 6,243,075 B1 | 6/2001 | Fishkin et al. |
| 6,348,663 B1 | 2/2002 | Schoos et al. |
| 6,351,205 B1 | 2/2002 | Armstrong |
| 6,360,598 B1 | 3/2002 | Calame et al. |
| 6,437,682 B1 | 8/2002 | Vance |
| 6,555,235 B1 | 4/2003 | Aufderheide et al. |
| 6,556,189 B1 | 4/2003 | Takahata et al. |
| 6,569,108 B2 | 5/2003 | Sarvazyan et al. |
| 6,610,936 B2 | 8/2003 | Gillespie et al. |
| 6,620,115 B2 | 9/2003 | Sarvazyan et al. |
| 6,629,343 B1 | 10/2003 | Chesney et al. |
| 6,668,230 B2 | 12/2003 | Mansky et al. |
| 6,720,712 B2 | 4/2004 | Scott et al. |
| 6,788,297 B2 | 9/2004 | Itoh et al. |
| 6,801,191 B2 | 10/2004 | Mukai et al. |
| 6,809,280 B2 | 10/2004 | Divigalpitiya et al. |
| 6,812,621 B2 | 11/2004 | Scott |
| 6,822,640 B2 | 11/2004 | Derocher |
| 6,879,318 B1 | 4/2005 | Chan et al. |
| 6,888,537 B2 | 5/2005 | Benson et al. |
| 6,915,702 B2 | 7/2005 | Omura et al. |
| 6,931,938 B2 | 8/2005 | Knirck et al. |
| 6,995,752 B2 | 2/2006 | Lu |
| 7,138,984 B1 | 11/2006 | Miles |
| 7,173,607 B2 | 2/2007 | Matsumoto et al. |
| 7,190,350 B2 | 3/2007 | Roberts |
| 7,215,329 B2 | 5/2007 | Yoshikawa et al. |
| 7,218,313 B2 | 5/2007 | Marcus et al. |
| 7,224,257 B2 | 5/2007 | Morikawa |
| 7,245,293 B2 | 7/2007 | Hoshino et al. |
| 7,273,979 B2 | 9/2007 | Christensen |
| 7,280,097 B2 | 10/2007 | Chen et al. |
| 7,318,349 B2 | 1/2008 | Vaganov et al. |
| 7,324,094 B2 | 1/2008 | Moilanen et al. |
| 7,324,095 B2 | 1/2008 | Sharma |
| 7,336,260 B2 | 2/2008 | Martin et al. |
| 7,337,085 B2 | 2/2008 | Soss |
| 7,345,680 B2 | 3/2008 | David |
| 7,367,232 B2 | 5/2008 | Vaganov |
| 7,406,661 B2 | 7/2008 | Väänänen et al. |
| 7,425,749 B2 | 9/2008 | Hartzell et al. |
| 7,426,873 B1 | 9/2008 | Kholwadwala et al. |
| 7,449,758 B2 | 11/2008 | Axelrod et al. |
| 7,460,109 B2 | 12/2008 | Safai et al. |
| 7,476,952 B2 | 1/2009 | Vaganov et al. |
| 7,508,040 B2 | 3/2009 | Nikkei et al. |
| 7,554,167 B2 * | 6/2009 | Vaganov ............... G06F 3/0338 257/730 |
| 7,607,111 B2 | 10/2009 | Vaananen et al. |
| 7,620,521 B2 | 11/2009 | Breed et al. |
| 7,629,969 B2 | 12/2009 | Kent |
| 7,649,522 B2 | 1/2010 | Chen et al. |
| 7,663,612 B2 | 2/2010 | Bladt |
| 7,685,538 B2 | 3/2010 | Fleck et al. |
| 7,698,084 B2 | 4/2010 | Soss |
| 7,701,445 B2 | 4/2010 | Inokawa et al. |
| 7,746,327 B2 | 6/2010 | Miyakoshi |
| 7,791,151 B2 | 9/2010 | Vaganov et al. |
| 7,819,998 B2 | 10/2010 | David |
| 7,825,911 B2 | 11/2010 | Sano et al. |
| 7,903,090 B2 | 3/2011 | Soss et al. |
| 7,921,725 B2 | 4/2011 | Silverbrook et al. |
| 7,952,566 B2 | 5/2011 | Poupyrev et al. |
| 7,973,772 B2 | 7/2011 | Gettemy et al. |
| 7,973,778 B2 | 7/2011 | Chen |
| 8,004,052 B2 | 8/2011 | Vaganov |
| 8,004,501 B2 | 8/2011 | Harrison |
| 8,013,843 B2 | 9/2011 | Pryor |
| 8,026,906 B2 | 9/2011 | Mölne et al. |
| 8,044,929 B2 | 10/2011 | Baldo et al. |
| 8,068,100 B2 | 11/2011 | Pryor |
| 8,072,437 B2 | 12/2011 | Miller et al. |
| 8,072,440 B2 | 12/2011 | Pryor |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,154,528 B2 | 4/2012 | Chen et al. |
| 8,159,473 B2 | 4/2012 | Cheng et al. |
| 8,164,573 B2 | 4/2012 | DaCosta et al. |
| 8,183,077 B2 | 5/2012 | Vaganov et al. |
| 8,184,093 B2 | 5/2012 | Tsuiki |
| 8,188,985 B2 | 5/2012 | Hillis et al. |
| 8,199,116 B2 | 6/2012 | Jeon et al. |
| 8,212,790 B2 | 7/2012 | Rimas-Ribikauskas et al. |
| 8,237,537 B2 | 8/2012 | Kurtz et al. |
| 8,243,035 B2 | 8/2012 | Abe et al. |
| 8,250,921 B2 | 8/2012 | Nasiri et al. |
| 8,253,699 B2 | 8/2012 | Son |
| 8,260,337 B2 | 9/2012 | Periyalwar et al. |
| 8,269,731 B2 | 9/2012 | Mölne |
| 8,289,288 B2 | 10/2012 | Whytock et al. |
| 8,289,290 B2 | 10/2012 | Klinghult |
| 8,297,127 B2 | 10/2012 | Wade et al. |
| 8,319,739 B2 | 11/2012 | Chu et al. |
| 8,325,143 B2 | 12/2012 | Destura et al. |
| 8,350,345 B2 | 1/2013 | Vaganov |
| 8,363,020 B2 | 1/2013 | Li et al. |
| 8,363,022 B2 | 1/2013 | Tho et al. |
| 8,378,798 B2 | 2/2013 | Bells et al. |
| 8,378,991 B2 | 2/2013 | Jeon et al. |
| 8,384,677 B2 | 2/2013 | Mak-Fan et al. |
| 8,387,464 B2 | 3/2013 | McNeil et al. |
| 8,405,631 B2 | 3/2013 | Chu et al. |
| 8,405,632 B2 | 3/2013 | Chu et al. |
| 8,421,609 B2 | 4/2013 | Kim et al. |
| 8,427,441 B2 | 4/2013 | Paleczny et al. |
| 8,436,806 B2 | 5/2013 | Almalki et al. |
| 8,436,827 B1 | 5/2013 | Zhai et al. |
| 8,451,245 B2 | 5/2013 | Heubel et al. |
| 8,456,440 B2 | 6/2013 | Abe et al. |
| 8,466,889 B2 | 6/2013 | Tong et al. |
| 8,477,115 B2 | 7/2013 | Rekimoto |
| 8,482,372 B2 | 7/2013 | Kurtz et al. |
| 8,493,189 B2 | 7/2013 | Suzuki |
| 8,497,757 B2 | 7/2013 | Kurtz et al. |
| 8,516,906 B2 | 8/2013 | Umetsu et al. |
| 8,931,347 B2 | 1/2015 | Donzier et al. |

(56) References Cited

U.S. PATENT DOCUMENTS

| | | |
|---|---|---|
| 8,984,951 B2 | 3/2015 | Landmann et al. |
| 9,487,388 B2 | 11/2016 | Brosh |
| 9,493,342 B2 | 11/2016 | Brosh |
| 9,984,990 B2 | 5/2018 | Umemoto |
| 10,161,817 B2 * | 12/2018 | Mayer ............ H01L 21/76 |
| 10,962,427 B2 | 3/2021 | Youssefi et al. |
| 11,362,067 B2 * | 6/2022 | Lee ............ H01L 24/80 |
| 11,446,665 B2 * | 9/2022 | Koksal ............ B01F 33/3011 |
| 2003/0067448 A1 | 4/2003 | Park |
| 2003/0189552 A1 | 10/2003 | Chuang et al. |
| 2004/0012572 A1 | 1/2004 | Sowden et al. |
| 2004/0140966 A1 | 7/2004 | Marggraff et al. |
| 2005/0190152 A1 | 9/2005 | Vaganov |
| 2006/0028441 A1 | 2/2006 | Armstrong |
| 2006/0244733 A1 | 11/2006 | Geaghan |
| 2006/0272413 A1 | 12/2006 | Vaganov et al. |
| 2006/0284856 A1 | 12/2006 | Soss |
| 2007/0035525 A1 | 2/2007 | Yeh et al. |
| 2007/0046649 A1 | 3/2007 | Reiner |
| 2007/0070046 A1 | 3/2007 | Sheynblat et al. |
| 2007/0070053 A1 | 3/2007 | Lapstun et al. |
| 2007/0097095 A1 | 5/2007 | Kim et al. |
| 2007/0103449 A1 | 5/2007 | Laitinen et al. |
| 2007/0103452 A1 | 5/2007 | Wakai et al. |
| 2007/0115265 A1 | 5/2007 | Rainisto |
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0245836 A1 | 10/2007 | Vaganov |
| 2007/0262965 A1 | 11/2007 | Hirai et al. |
| 2007/0277616 A1 | 12/2007 | Nikkel et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0088600 A1 | 4/2008 | Prest et al. |
| 2008/0088602 A1 | 4/2008 | Hotelling |
| 2008/0094367 A1 | 4/2008 | Van De Ven et al. |
| 2008/0105057 A1 | 5/2008 | Wade |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237275 A1 | 9/2009 | Vaganov |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1 | 12/2010 | Meade |
| 2010/0315373 A1 | 12/2010 | Steinhauser et al. |
| 2010/0321310 A1 | 12/2010 | Kim et al. |
| 2010/0321319 A1 | 12/2010 | Hefti et al. |
| 2010/0323467 A1 | 12/2010 | Vaganov et al. |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christoffersen |
| 2011/0039602 A1 | 2/2011 | McNamara |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0113881 A1 | 5/2011 | Suzuki |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0215672 A1 | 9/2011 | Yamaoka et al. |
| 2011/0227836 A1 | 9/2011 | Li et al. |
| 2011/0242014 A1 | 10/2011 | Tsai et al. |
| 2011/0254111 A1 | 10/2011 | Leclair et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2011/0308324 A1 | 12/2011 | Gamage et al. |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056837 A1 | 3/2012 | Park et al. |
| 2012/0060605 A1 | 3/2012 | Wu et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0091546 A1 * | 4/2012 | Langereis ............ H04R 31/006 257/416 |

(56) References Cited

U.S. PATENT DOCUMENTS

| | | |
|---|---|---|
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Mäenpää |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0286379 A1 | 11/2012 | Inoue |
| 2012/0319987 A1 | 12/2012 | Woo |
| 2012/0327025 A1 | 12/2012 | Huska et al. |
| 2013/0008263 A1 | 1/2013 | Kabasawa et al. |
| 2013/0038541 A1 | 2/2013 | Bakker |
| 2013/0093685 A1 | 4/2013 | Kalu et al. |
| 2013/0096849 A1 | 4/2013 | Campbell et al. |
| 2013/0140944 A1 | 6/2013 | Chen et al. |
| 2013/0341741 A1 | 12/2013 | Brosh |
| 2013/0341742 A1 | 12/2013 | Brosh |
| 2014/0007705 A1 | 1/2014 | Campbell et al. |
| 2014/0028575 A1 | 1/2014 | Parivar et al. |
| 2014/0055407 A1 | 2/2014 | Lee et al. |
| 2014/0367811 A1 | 12/2014 | Nakagawa et al. |
| 2015/0145076 A1 | 5/2015 | Kim et al. |
| 2016/0069927 A1 | 3/2016 | Hamamura |
| 2016/0137491 A1 | 5/2016 | Su et al. |
| 2016/0332866 A1 | 11/2016 | Brosh et al. |
| 2016/0347606 A1 | 12/2016 | Bruno et al. |
| 2017/0234744 A1 | 8/2017 | Tung et al. |
| 2017/0369306 A1* | 12/2017 | Bieselt ............... B81B 7/0054 |
| 2018/0167740 A1* | 6/2018 | Uchida ............... H04R 19/01 |
| 2018/0366424 A1 | 12/2018 | Borrego Lambin Torres Amaral et al. |
| 2022/0289558 A1* | 9/2022 | Tao .................. B81C 1/00158 |

FOREIGN PATENT DOCUMENTS

| | | | |
|---|---|---|---|
| DE | 102010012441 | | 9/2011 |
| JP | H09172223 A | * | 6/1997 |
| JP | 2004-156937 | | 6/2004 |
| JP | 2010147268 | | 7/2010 |
| WO | 2004/113859 | | 12/2004 |
| WO | 2007/139695 | | 12/2007 |
| WO | 2013/067548 | | 5/2013 |

OTHER PUBLICATIONS

Nesterov, V., et al., "Modelling and investigation of the silicon twin design 3D micro probe," Journal of Micromechanics and Microengineering, vol. 15, 2005, pp. 514-520.

Non-Final Office Action for U.S. Appl. No. 16/739,687, dated Aug. 27, 2020, 8 pages.

Notice of Allowance for U.S. Appl. No. 16/739,687, dated Feb. 16, 2021, 8 pages.

* cited by examiner

SLOTTED MEMS FORCE SENSOR

CROSS-REFERENCE TO RELATED APPLICATIONS

This application is a continuation U.S. patent application Ser. No. 16/739,687, filed on Jan. 10, 2020, and entitled "SLOTTED MEMS FORCE SENSOR," which claims the benefit of U.S. provisional patent application No. 62/790,513, filed on Jan. 10, 2019, and entitled "SLOTTED MEMS FORCE SENSOR," the disclosures of which are expressly incorporated herein by reference in their entireties.

FIELD OF TECHNOLOGY

The present disclosure relates to a stress concentration design for a MEMS force sensor which improves the sensitivity.

BACKGROUND

The state of the art of MEMS force sensor design are in two major categories. One is a seal cavity sensor with the stress concentration already built-in. The other is single piece of substrate relying on the solder bumps arrangement to provide stress concentration. The latter is very easy for mass production and the cost is low, however the sensitivity of such MEMS force sensor is not optimal. At some extreme cases, the sensitivity may not be sufficient to functionalize a thick sensing substrate or through very soft material such as foam.

SUMMARY

The present disclosure pertains a MEMS force sensor with stress concentration design to increase the sensitivity for extreme usage cases such as hard sensing substrate or through a soft foam. By selectively removing material on the silicon substrate of the sensor chip, the maximum stress can be improved by a factor of 2 or more. This results in a MEMS sensor chip with slots, selective thinning region or a combination of both. The MEMS sensors described herein are not sealed sensors, e.g., there is no cap bonded to the sensor substrate.

An example microelectromechanical system ("MEMS") force sensor is described herein. The MEMS force sensor can include a semiconductor substrate, a plurality of electrical connectors disposed on the semiconductor substrate, at least one through slot formed on the semiconductor substrate, and at least one sensing element formed on the semiconductor substrate. The at least one through slot is disposed in a stress concentration region and is configured to create stress concentration. Additionally, the at least one sensing element is disposed in the stress concentration region. The at least one sensing element is configured to change an electrical characteristic in response to stress.

Optionally, the MEMS sensor further includes a selective thinning region formed on the semiconductor substrate. The selective thinning region is disposed in the stress concentration region and is configured to further increase the stress concentration.

In some implementations, the at least one sensing element is formed by implantation or diffusion.

In some implementations, the semiconductor substrate comprises electrical routing, where at least one of the electrical connectors and the at least one sensing element is electrically coupled via the electrical routing.

In some implementations, the electrical connectors are solder bumps or metal pillars.

In some implementations, the semiconductor substrate is formed of silicon or gallium arsenide.

In some implementations, each of the electrical connectors is arranged in a respective corner of the semiconductor substrate.

In some implementations, the at least one through slot is disposed in proximity to one of the electrical connectors. Optionally, the at least one sensing element is arranged between the at least one through slot and the one of the electrical connectors.

Another example MEMS force sensor is described herein. The MEMS force sensor can include a semiconductor substrate, a plurality of electrical connectors disposed on the semiconductor substrate, a selective thinning region formed on the semiconductor substrate, and at least one sensing element formed on the semiconductor substrate. The selective thinning region is disposed in a stress concentration region and is configured to create stress concentration. Additionally, the at least one sensing element is disposed in the stress concentration region. The at least one sensing element is configured to change an electrical characteristic in response to stress.

Yet another example MEMS force sensor is described herein. The MEMS force sensor can include a semiconductor substrate, a plurality of electrical connectors disposed on the semiconductor substrate, at least one blind slot formed on the semiconductor substrate, and at least one sensing element formed on the semiconductor substrate. The at least one blind slot is disposed in a stress concentration region and is configured to create stress concentration. Additionally, the at least one sensing element is disposed in the stress concentration region. The at least one sensing element is configured to change an electrical characteristic in response to stress. The at least one blind slot extends only partially through the semiconductor substrate.

In some implementations, the at least one blind slot is disposed in proximity to one of the electrical connectors. Optionally, the at least one sensing element is arranged between the at least one blind slot and the one of the electrical connectors.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE FIGURES

The components in the drawings are not necessarily to scale relative to each other. Like reference numerals designate corresponding parts throughout the several views. These and other features of will become more apparent in the detailed description in which reference is made to the appended drawings wherein.

DETAILED DESCRIPTION

The present disclosure can be understood more readily by reference to the following detailed description, examples, drawings, and their previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made, while still obtaining beneficial results. It will also be apparent that some of the desired benefits can be obtained by selecting some of the features without utilizing other features. Accordingly, those who work in the art will recognize that many modifications and adaptations may be possible and can even be desirable in certain circumstances, and are contemplated by this disclosure. Thus, the following description is provided as illustrative of the principles and not in limitation thereof.

As used throughout, the singular forms "a," "an" and "the" include plural referents unless the context clearly dictates otherwise. Thus, for example, reference to "a sensing element" can include two or more such sensing element unless the context indicates otherwise.

The term "comprising" and variations thereof as used herein is used synonymously with the term "including" and variations thereof and are open, non-limiting terms.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

The present disclosure relates to a MEMS force sensor design with slots, selective thinning or a combination of both.

Figure 1:
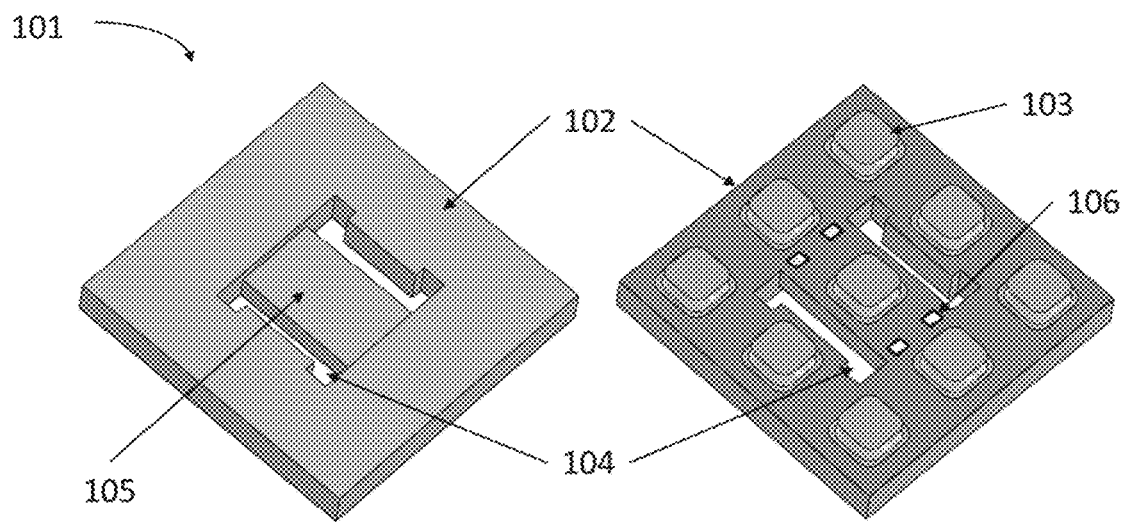
FIG. 1 is a three-dimensional (3D) perspective view of an example MEMS force sensor with 9 bumps and through slots and selective thinning region.

FIG. 1 illustrates the 3D perspective view of a MEMS force sensor 101 with through slots and selectively thinning according to one implementation described herein. The MEMS force sensor 101 is not a sealed sensor, e.g., there is no cap bonded to the semiconductor substrate. The MEMS force sensor 101 includes a semiconductor substrate 102, a plurality of electrical connectors 103, through slots 104, a selective thinning region 105, and a plurality of sensing elements 106. In some implementations, the semiconductor substrate 102 can be formed of silicon (Si) or gallium arsenide (GaAs). In some implementations, the semiconductor substrate 102 can be formed of another material that can be doped form a piezoresistive sensing element. In the examples described herein, the electrical connectors 103 are solder bumps. In FIG. 1, the MEMS force sensor 101 includes nine electrical connectors 103, which are arranged in three rows. There is an electrical connector 103 provided in proximity to each of the corners of the semiconductor substrate 102. It should be understood that the number, size, shape and/or arrangement of the electrical connectors 103 in FIG. 1 are provided only as an example. This disclosure contemplates providing a MEMS force sensors having different number, sized, shaped and/or arrangement of electrical connectors. Additionally, although solder bumps are provided as an example, this disclosure contemplates using metal pillars (e.g., copper, nickel, or other metal) instead of solder bumps with the implementations described herein. It should be understood that the solder bumps and metal pillars are only provided as examples and that other types of electrical connectors can be used with the implementations described herein.

Additionally, the through slots 104 are openings that extend entirely through the semiconductor substrate 102. It should be understood that the through slots 104 can be formed by completely removing a portion of the semiconductor substrate 102 (e.g., by etching). A through slot 104 is arranged in a stress concentration region, which is the location of maximum stress during normal operation of the MEMS force sensor 101. The through slot 104 is configured to concentrate the stress. It should be understood that the number, size, and/or shape of the through slots 104 in FIG. 1 are provided only as an example. This disclosure contemplates providing MEMS force sensors having different number, sized, and/or shaped through slots. The selective thinning region 105 is a region on the semiconductor substrate 102 where a portion of the material is removed. In other words, the thickness of the substrate in the selective thinning region 105 is less than the thickness of the substrate in other regions of the semiconductor substrate 102 (e.g., near the edges of the substrate). It should be understood that the selective thinning region 105 can be formed by partially removing a portion of the semiconductor substrate 102 (e.g., by etching). The selective thinning region 105 is arranged in a stress concentration region, which is the location of maximum stress during normal operation of the MEMS force sensor 101. The selective thinning region 105 is configured to concentrate the stress. It should be understood that the number, size, and/or shape of the selective thinning region 105 in FIG. 1 are provided only as an example. This disclosure contemplates providing MEMS force sensors having different number, sized, and/or shaped selective thinning regions. As described herein, the MEMS force sensor can include a through slot, a selective thinning region, or both. When used in combination, the through slot and selective thinning region work together to concentrate the stress.

As discussed above, the MEMS force sensor 101 includes a plurality of sensing elements 106. As shown in FIG. 1, the sensing elements 106 are disposed on a surface of the semiconductor substrate 102. Optionally, in some implementations, the MEMS force sensor 101 can include a single sensing element 106. This disclosure contemplates that the sensing elements 106 can be diffused, deposited, or implanted on a surface of the semiconductor substrate 102. The sensing elements 106 change an electrical characteristic (e.g., resistance, capacitance, charge, etc.) in response to deflection of the semiconductor substrate 102. In one implementation, the sensing elements 106 are optionally piezoresistive sensing elements (e.g., piezoresistive transducers). Although piezoresistive transducers are provided as an example sensing element, this disclosure contemplates that the sensing elements 106 can be any sensor element configured to change at least one electrical characteristic (e.g., resistance, charge, capacitance, etc.) based on an amount or magnitude of an applied force and can output a signal proportional to the amount or magnitude of the applied force. Other types of sensing elements include, but not limited to, piezoelectric or capacitive sensors.

The sensing elements 106 are electrically coupled to the electrical connectors 103 through electrical routing (not shown) arranged on the semiconductor substrate 102 thus transforming the stress into electrical signal. The sensing elements 106 are strategically placed at a location where the stress is maximum (i.e., a "stress concentration region") during normal operation. It should be understood that the stress concentration region(s) can be determined or located by simulation (e.g., finite element analysis) during design of the MEMS force sensor 101. As described above, the through slots 104 and selective thinning region 105 are configured to concentrate stress in this region. In FIG. 1, the combination of the through slots 104 and the selective thinning region 105 together forms a thinned beam. This increases the sensitivity of the MEMS force sensor 101. The maximum stress locations (i.e., the "stress concentration regions") are typically at the edge of the thinned beam, which is the case for the MEMS force sensor 101. As shown in FIG. 1, the sensing elements 106 are arranged on the thinned beam, e.g., on the selective thinned region 105. Additionally, the sensing elements 106 are arranged in proximity to the edge of the thinned beam. In FIG. 1, the thinned beam forms a deformable membrane, which can be used for sensing strain. The sensing elements 106 are therefore configured to convert a strain on a surface of the semiconductor substrate 102 to an analog electrical signal that is proportional to the strain. It should be understood that the number and/or arrangement of the sensing elements 106 in FIG. 1 are provided only as an example. This disclosure contemplates providing a MEMS force sensors having different number and/or arrangements of sensing elements.

Figure 2:
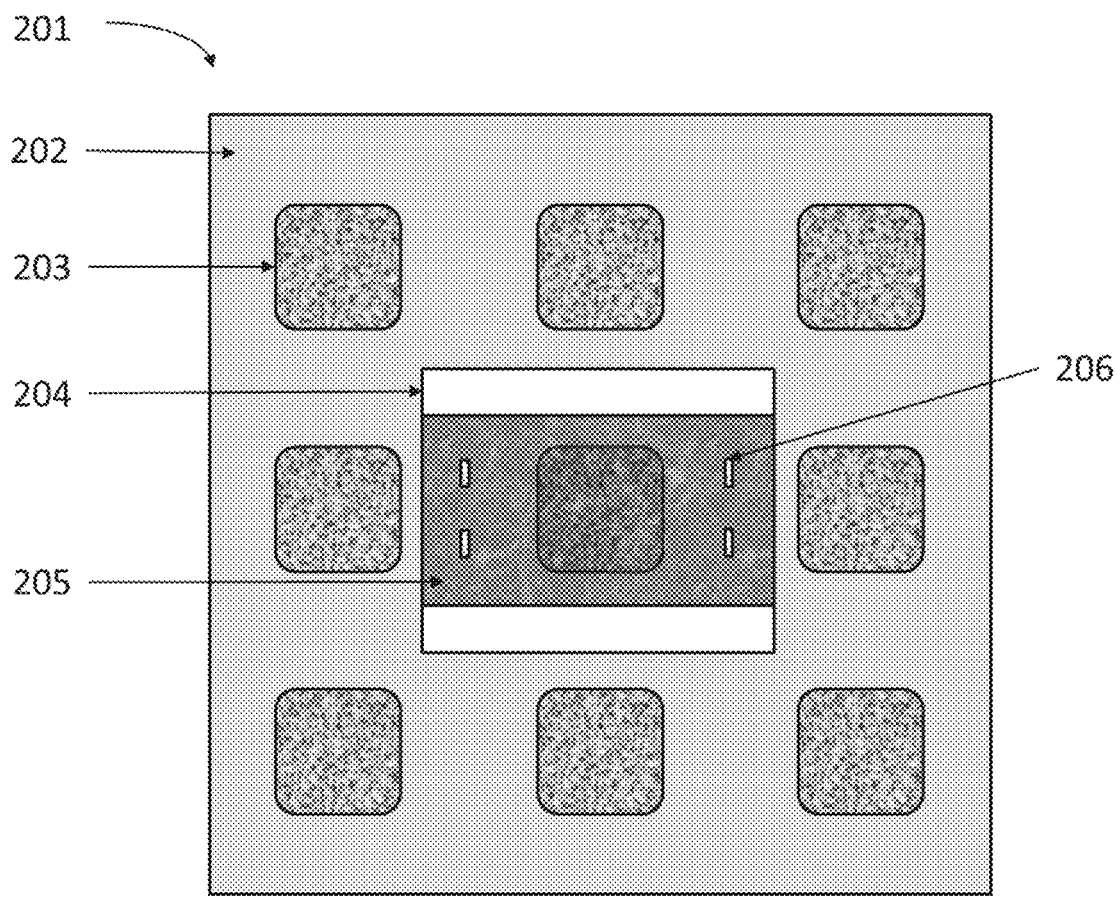
FIG. 2 is a top view of another example MEMS force sensor with through slots and selective thinning region.

FIG. 2 further illustrates the two-dimensional (2D) view of a MEMS force sensor 201 with slots and selectively thinning according to another implementation described herein. The MEMS force sensor 201 is not a sealed sensor, e.g., there is no cap bonded to the semiconductor substrate. The MEMS force sensor 201 includes a semiconductor substrate 202, a plurality of electrical connectors 203, through slots 204, a selective thinning region 205, and a plurality of sensing elements 206. The semiconductor substrate, electrical connectors, through slots, selective thinning region, and sensing elements are described in detail above with regard to FIG. 1. It should be understood that the semiconductor substrate 202, electrical connectors 203, through slot 204, selective thinning region 205, and sensing elements 206 in FIG. 2 may have characteristics as described above with regard to FIG. 1. The sensing elements 206 are electrically coupled to the electrical connectors 203 through electrical routing (not shown) arranged on the semiconductor substrate 202 thus transforming the stress into electrical signal. The sensing elements 206 are strategically placed at a location where the stress is maximum (i.e., a "stress concentration region") during normal operation. As described above, the stress concentration region(s) can be determined or located by simulation during design of the MEMS force sensor 201. As described above, the through slots 204 and selective thinning region 205 are configured to concentrate stress in this region. Similar to FIG. 1, the combination of the through slots 204 and the selective thinning region 205 together form a thinned beam. This increases the sensitivity of the MEMS force sensor 201. As shown in FIG. 2, the sensing elements 206 are arranged on the selective thinning region 205 and also arranged in proximity to the edge of the thinned beam. The maximum stress locations are typically at the edge of the thinned beam, which is the case for the MEMS force sensor 201. In this implementation, there are a total of 9 electrical connectors 203.

Figure 3:
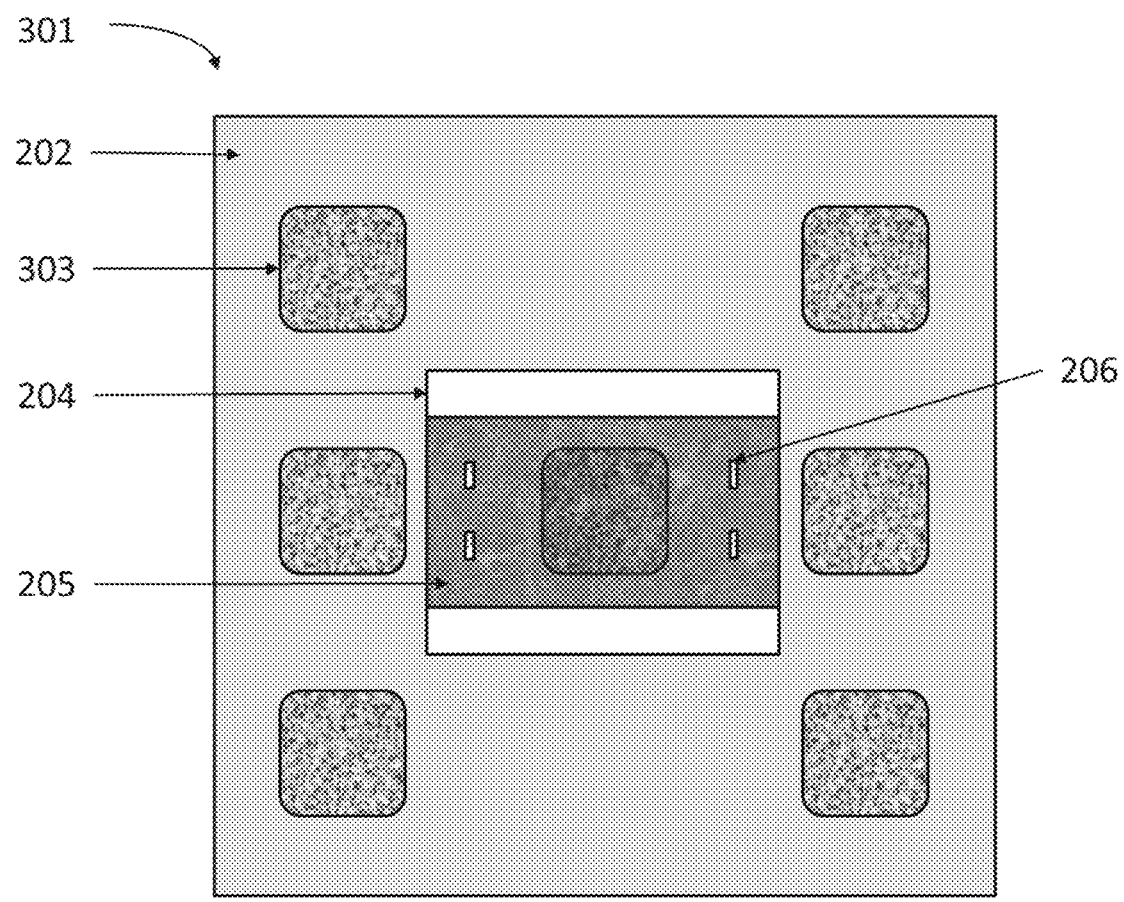
FIG. 3 is a top view of another example MEMS force sensor with through slots and selective thinning region.

FIG. 3 illustrates another implementation similar to FIG. 2. The MEMS force sensor 301 is not a sealed sensor, e.g., there is no cap bonded to the semiconductor substrate. The MEMS force sensor 301 with slots and selectively thinning includes a semiconductor substrate 202, a plurality of electrical connectors 303, through slots 204, a selective thinning region 205, and a plurality of sensing elements 206. The semiconductor substrate, electrical connectors, through slots, selective thinning region, and sensing elements are described in detail above with regard to FIG. 1. It should be understood that the semiconductor substrate 202, electrical connectors 303, through slot 204, selective thinning region 205, and sensing elements 206 in FIG. 3 may have characteristics as described above with regard to FIG. 1. The sensing elements 206 are electrically coupled to the electrical connectors 303 through electrical routing (not shown) arranged on the semiconductor substrate 202 thus transforming the stress into electrical signal. The sensing elements 206 are strategically placed at a location where the stress is maximum (i.e., a "stress concentration region") during normal operation. As described above, the stress concentration region(s) can be determined or located by simulation during design of the MEMS force sensor 301. As described above, the through slots 204 and selective thinning region 205 are configured to concentrate stress in this region. The combination of the through slots 204 and the selective thinning region 205 together forms a thinned beam. This increases the sensitivity of the MEMS force sensor 301. The maximum stress locations are typically at the edge of the thinned beam, which is the case for the MEMS force sensor 301. As shown in FIG. 3, the sensing elements 206 are arranged on the selective thinning region 205 and also are arranged in proximity to the edge of the thinned beam. In this implementation, there are a total of 7 solder bumps 303.

Figure 4:
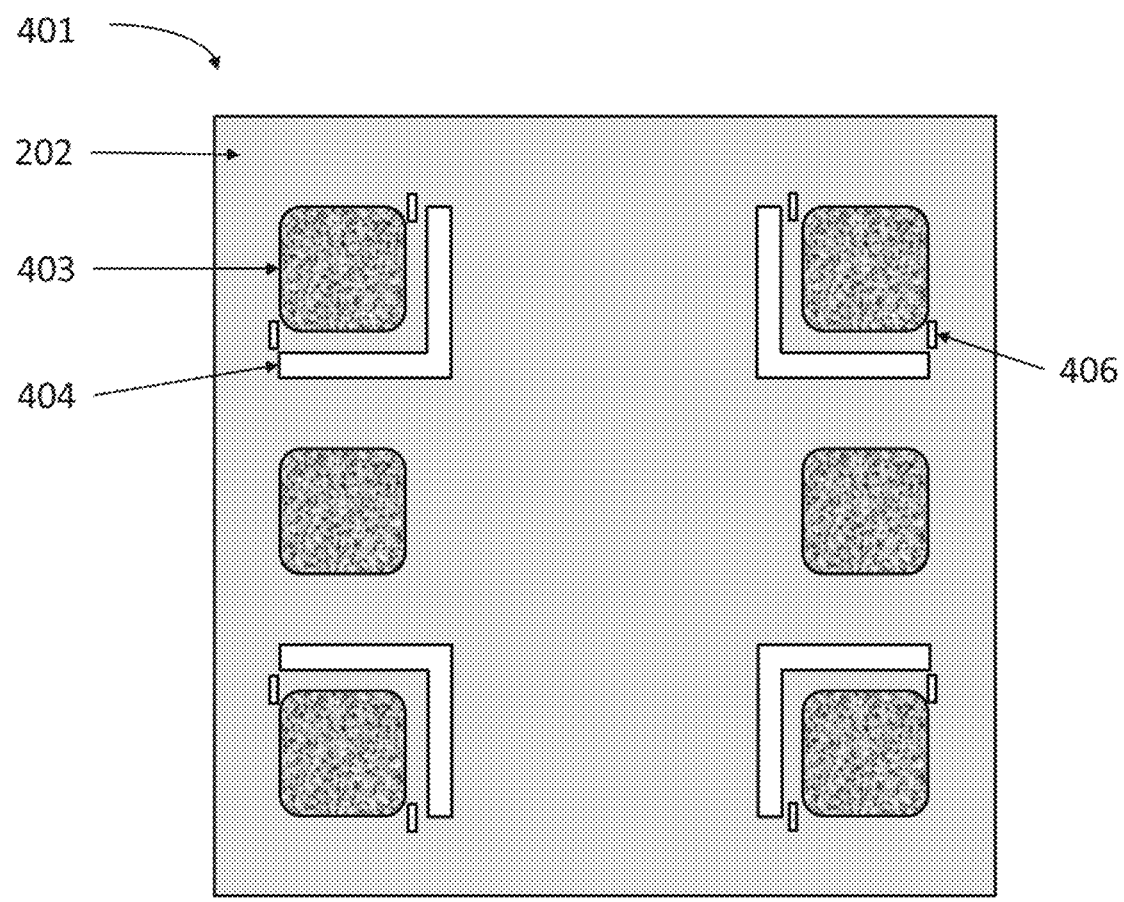
FIG. 4 is a top view of another example MEMS force sensor with through slots located in proximity to corner electrical connectors.

FIG. 4 illustrates another implementation of the MEMS force sensor with through slots only (i.e., not including a selective thinning region). The MEMS force sensor 401 is not a sealed sensor, e.g., there is no cap bonded to the semiconductor substrate. The MEMS force sensor 401 includes a semiconductor substrate 202, a plurality of electrical connectors 403, through slots 404, and a plurality of sensing elements 406. The semiconductor substrate, electrical connectors, through slots, and sensing elements are described in detail above with regard to FIG. 1. It should be understood that the semiconductor substrate 202, electrical connectors 403, through slot 404, and sensing elements 406 in FIG. 4 may have characteristics as described above with regard to FIG. 1. The through slots 404 are placed only in proximity to the electrical connectors 403 that are arranged at the corners of the MEMS force sensor 401. This increases the sensitivity of the MEMS force sensor 401. There are no through slots arranged near the other electrical connectors 403 (e.g., middle connectors). The sensing elements 406 are electrically coupled to the electrical connectors 403 through electrical routing (not shown) arranged on the semiconductor substrate 202 thus transforming the stress into electrical signal. The sensing elements 406 are strategically placed at a location where the stress is maximum (i.e., a "stress concentration region") which is located between the through slots 404 and electrical connectors 403. As shown in FIG. 4, a sensing element 406 is arranged in proximity to each opposing end of a through slot 404, which are "L" shaped. As described above, the stress concentration region(s) can be determined or located by simulation during design of the MEMS force sensor 401. As described above, the through slots 404 are configured to concentrate stress in this region. In this implementation, there are a total of 6 electrical connectors 403.

Figure 5:
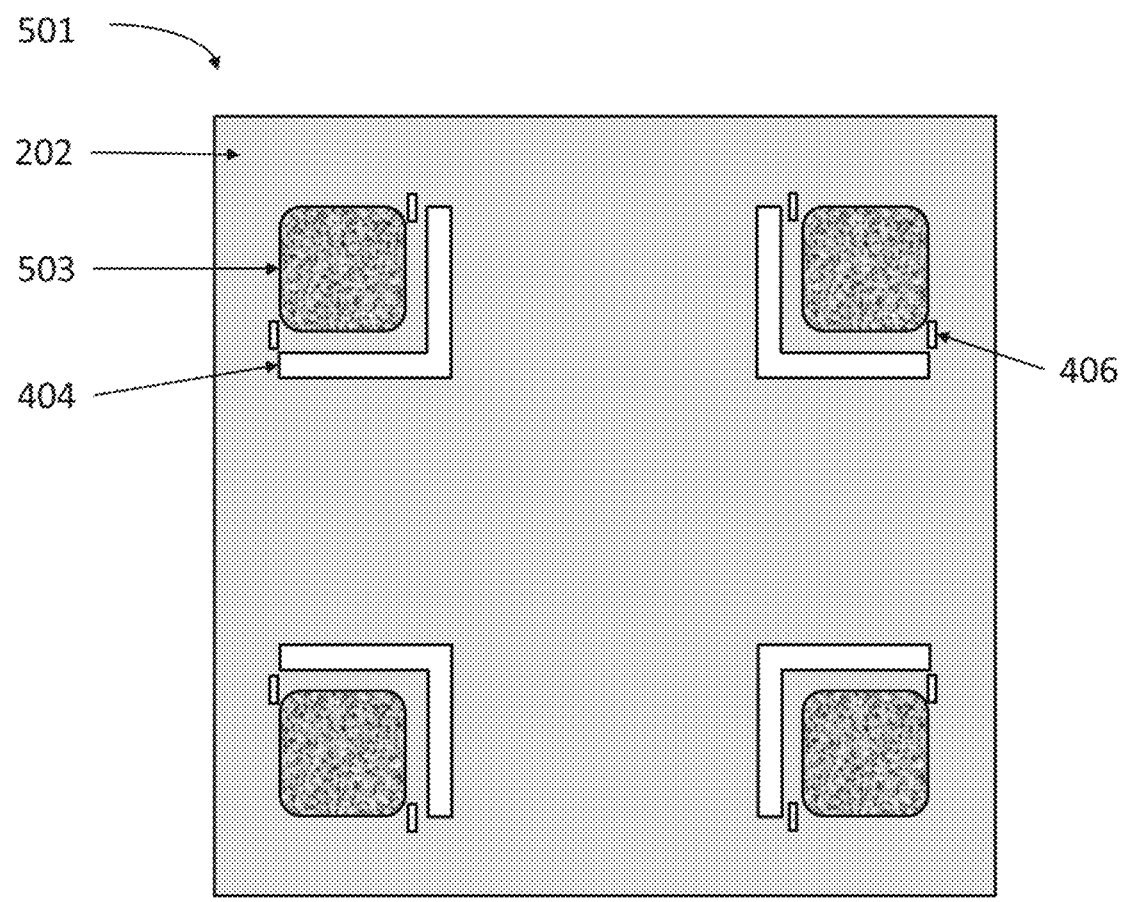
FIG. 5 is a top view of another example MEMS force sensor with through slots located in proximity to corner electrical connectors.

FIG. 5 illustrates yet another implementation of the MEMS force sensor with through slots only. The MEMS force sensor 501 is not a sealed sensor, e.g., there is no cap bonded to the semiconductor substrate. The MEMS force sensor 501 with slots includes a semiconductor substrate 202, a plurality of electrical connectors 503, through slots 404, and a plurality of sensing elements 406. The semiconductor substrate, electrical connectors, through slots, and sensing elements are described in detail above with regard to FIG. 1. It should be understood that the semiconductor substrate 202, electrical connectors 503, through slot 404, and sensing elements 406 in FIG. 5 may have characteristics as described above with regard to FIG. 1. The through slots 404 are placed only in proximity to the electrical connectors 403, each of which is arranged at a corner of the MEMS force sensor 501. This increases the sensitivity of the MEMS force sensor 501. There are no additional electrical connectors in the MEMS sensor 501 (compare to FIG. 4). The sensing elements 406 are electrically coupled to the electrical connectors 503 through electrical routing (not shown) arranged on the semiconductor substrate 202 thus transforming the stress into electrical signal. The sensing elements 406 are strategically placed at a location where the stress is maximum (i.e., a "stress concentration region") which is between the through slots 404 and solder bumps 503. As shown in FIG. 5, a sensing element 406 is arranged in proximity to each opposing end of a through slot 404, which are "L" shaped. As described above, the stress concentration region(s) can be determined or located by simulation during design of the MEMS force sensor 501. As described above, the through slots 404 are configured to concentrate stress in this region. In this implementation, there are a total of 4 electrical connectors 503.

Figure 6:
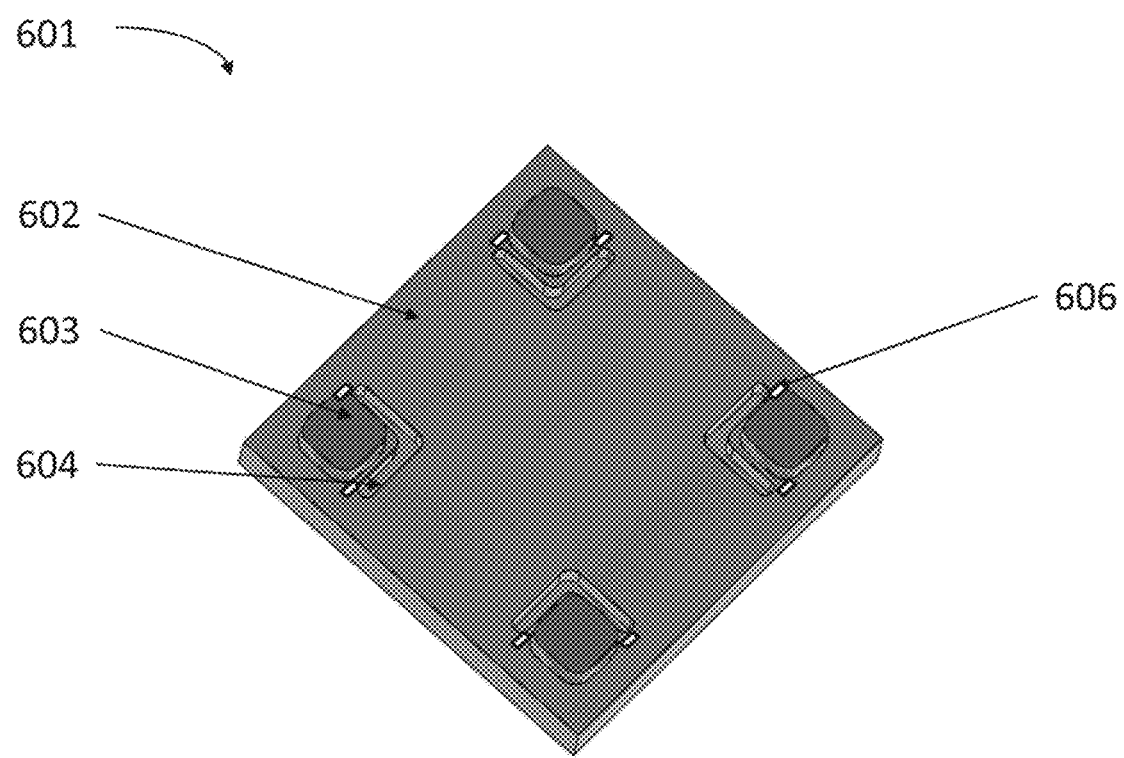
FIG. 6 is a 3D perspective view of another example MEMS force sensor with through blind slots located in proximity to corner electrical connectors.

FIG. 6 further illustrates the 3D view of the similar implementation of the MEMS force sensor in FIG. 5. The MEMS force sensor 601 is not a sealed sensor, e.g., there is no cap bonded to the semiconductor substrate. The MEMS force sensor 601 with slots includes a semiconductor substrate 602, a plurality of electrical connectors 603, blind slots 604, and a plurality of sensing elements 606. The semiconductor substrate, electrical connectors, and sensing elements are described in detail above with regard to FIG. 1. It should be understood that the semiconductor substrate 602, electrical connectors 603, and sensing elements 606 in FIG. 6 may have characteristics as described above with regard to FIG. 1. The blind slots 604 are placed only in proximity to the solder bumps 403, each of which is arranged at a corner of the MEMS force sensor 601. This increases the sensitivity of the MEMS force sensor 601. The blind slots 604 do not extend entirely through the semiconductor substrate 602. This is in comparison to the through slots shown in FIG. 5. For example, the blind slots 604 are openings that extend only partially through the semiconductor substrate 602. It should be understood that the blind slots 604 can be formed by removing a portion of the semiconductor substrate 602 (e.g., by etching). It should be understood that the number, size, and/or shape of the blind slots 604 in FIG. 6 are provided only as an example. The sensing elements 606 are electrically coupled to the solder bumps 603 through electrical routing (not shown) arranged on the silicon substrate 602 thus transforming the stress into electrical signal. The sensing elements 606 are strategically placed at a location where the stress is maximum (i.e., a "stress concentration region") which is between the blind slots 604 and solder bumps 603. As shown in FIG. 6, a sensing element 606 is arranged in proximity to each opposing end of a blind slot 604, which are "L" shaped. As described above, the stress concentration region can be determined or located by simulation during design of the MEMS force sensor 601. The blind slots 604 are configured to concentrate stress in this region. In this implementation, there are a total of 4 electrical connectors 603.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A microelectromechanical system ("MEMS") force sensor, comprising:
   a semiconductor substrate;
   at least one slot formed on the semiconductor substrate, wherein the at least one slot defines opposing ends, and wherein the at least one slot is configured to create a stress concentration region on the semiconductor substrate in proximity to at least one of the opposing ends of the at least one slot; and
   at least one sensing element formed on the semiconductor substrate, wherein the at least one sensing element is disposed in the stress concentration region, and wherein the at least one sensing element is configured to change an electrical characteristic in response to stress.

2. The MEMS force sensor of claim 1, wherein the at least one slot is an opening extending entirely through the semiconductor substrate.

3. The MEMS force sensor of claim 1, wherein the at least one slot is an opening extending only partially through the semiconductor substrate.

4. The MEMS force sensor of claim 1, wherein the at least one slot has an elongated shape.

5. The MEMS force sensor of claim 1, wherein the at least one slot is configured to create a respective stress concentration region on the semiconductor substrate in proximity to each of the opposing ends of the at least one slot.

6. The MEMS force sensor of claim 1, further comprising a selective thinning region formed on the semiconductor substrate, wherein the selective thinning region is disposed in the stress concentration region.

7. The MEMS force sensor of claim 6, further comprising a plurality of slots, wherein the selective thinning region and the slots form a thinned beam.

8. The MEMS force sensor of claim 1, wherein the at least one sensing element is formed by implantation or diffusion.

9. The MEMS force sensor of claim 1, further comprising a plurality of electrical connectors disposed on the semiconductor substrate.

10. The MEMS force sensor of claim 9, further comprising electrical routing disposed on the semiconductor substrate, wherein at least one of the electrical connectors and the at least one sensing element are electrically coupled via the electrical routing.

11. The MEMS force sensor of claim 9, wherein the electrical connectors are solder bumps or metal pillars.

12. The MEMS force sensor of claim 9, wherein each of the electrical connectors is arranged in a respective corner of the semiconductor substrate.

13. The MEMS force sensor of claim 12, wherein the at least one slot is disposed in proximity to one of the electrical connectors.

14. The MEMS force sensor of claim 13, wherein the at least one slot has an elongated L shape.

15. The MEMS force sensor of claim 13, wherein the at least one sensing element is arranged between the at least one slot and the one of the electrical connectors.

16. The MEMS force sensor of claim 1, wherein the semiconductor substrate is formed of silicon or gallium arsenide.

\* \* \* \* \*